United States Patent
Disegni

(10) Patent No.: US 10,824,417 B2
(45) Date of Patent: Nov. 3, 2020

(54) REAL-TIME UPDATE METHOD FOR A DIFFERENTIAL MEMORY, DIFFERENTIAL MEMORY AND ELECTRONIC SYSTEM

(71) Applicant: STMicroelectronics S.r.l., Agrate Brianza (MB) (IT)

(72) Inventor: Fabio Enrico Carlo Disegni, Spino d'adda (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/225,557

(22) Filed: Dec. 19, 2018

(65) Prior Publication Data

US 2019/0213000 A1 Jul. 11, 2019

(30) Foreign Application Priority Data

Jan. 5, 2018 (IT) .......................... 102018000000580

(51) Int. Cl.

| | |
|---|---|
| *G06F 8/654* | (2018.01) |
| *G11C 7/22* | (2006.01) |
| *G06F 8/656* | (2018.01) |
| *G06F 8/658* | (2018.01) |
| *G11C 13/00* | (2006.01) |

(Continued)

(52) U.S. Cl.
CPC .............. *G06F 8/654* (2018.02); *G06F 8/656* (2018.02); *G06F 8/658* (2018.02); *G11C 7/22* (2013.01); *G11C 13/0033* (2013.01); *H04L 67/12* (2013.01); *H04L 67/34* (2013.01); *G11C 11/1693* (2013.01); *G11C 11/2293* (2013.01); *G11C 13/0061* (2013.01); *G11C 2013/0042* (2013.01); *G11C 2013/0066* (2013.01)

(58) Field of Classification Search
CPC .......... G06F 8/654; G06F 8/656; G06F 8/658; G11C 7/22; G11C 11/1693; G11C 11/2293; G11C 13/0033; G11C 13/0061; G11C 2013/0042; G11C 2013/0066; H04L 67/12; H04L 67/34
USPC ...................................... 717/168–173; 711/5
See application file for complete search history.

(56) References Cited

U.S. PATENT DOCUMENTS

| | | |
|---|---|---|
| 4,292,676 A | 9/1981 | Henig |
| 5,950,224 A | 9/1999 | Devin |

(Continued)

FOREIGN PATENT DOCUMENTS

| | | |
|---|---|---|
| DE | 102016214879 A1 | 2/2018 |
| WO | 2008058101 A2 | 5/2008 |
| WO | 2016196835 A1 | 12/2016 |

*Primary Examiner* — Qing Chen
(74) *Attorney, Agent, or Firm* — Slater Matsil, LLP

(57) ABSTRACT

A method for management of a differential memory includes storing first logic data associated with a first informative content in an auxiliary memory module of the differential memory; storing third logic data associated with a second informative content in a second submodule of a main memory module by overwriting second logic data associated with the first informative content while maintaining the first logic data contained in a first submodule of the main memory module unaltered; when the third logic data is being stored, reading the first logic data from the auxiliary memory module in a single-ended mode in response to a request for reading the first informative content; otherwise, reading the first logic data from the first submodule; and reading the third logic data in single-ended mode.

22 Claims, 9 Drawing Sheets

(51) Int. Cl.
*H04L 29/08* (2006.01)
*G11C 11/22* (2006.01)
*G11C 11/16* (2006.01)

(56) References Cited

U.S. PATENT DOCUMENTS

| | | |
|---|---|---|
| 6,151,236 A | 11/2000 | Bondurant et al. |
| 2008/0043512 A1 | 2/2008 | Fukushi |
| 2008/0170431 A1 | 7/2008 | Sheu et al. |
| 2015/0339069 A1* | 11/2015 | Nishikubo ............ G06F 3/0608 711/103 |
| 2016/0358640 A1 | 12/2016 | Brederlow et al. |
| 2018/0166131 A1 | 6/2018 | Chen et al. |

* cited by examiner

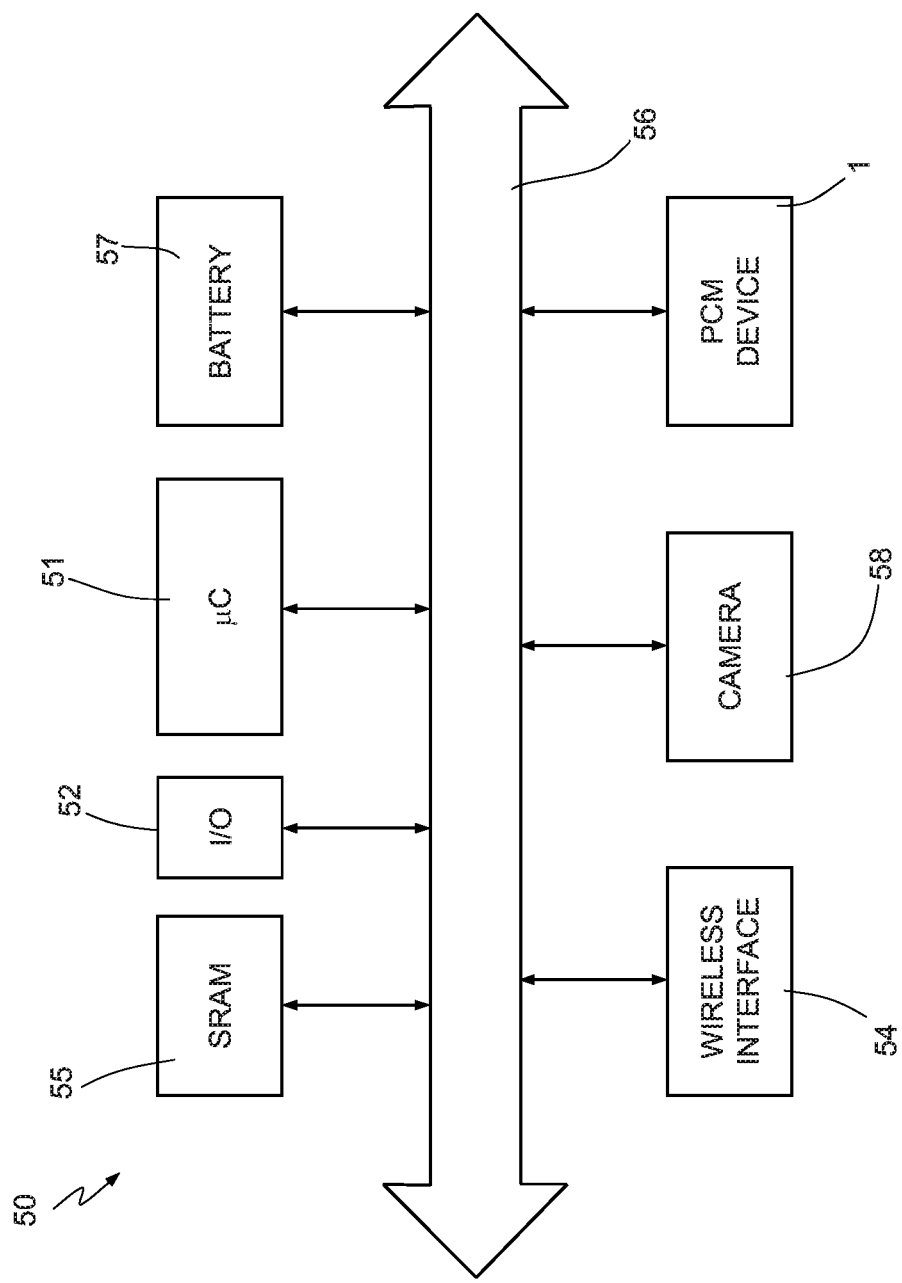

REAL-TIME UPDATE METHOD FOR A DIFFERENTIAL MEMORY, DIFFERENTIAL MEMORY AND ELECTRONIC SYSTEM

CROSS-REFERENCE TO RELATED APPLICATIONS

This application claims the benefit of Italian Application No. 102018000000580, filed on Jan. 5, 2018, which application is hereby incorporated herein by reference.

This application is filed concurrently with U.S. patent application Ser. No. 16/225,492, which claims the benefit of Italian Application No. 102018000000581, filed on Jan. 5, 2018, which applications are hereby incorporated herein by reference.

TECHNICAL FIELD

The present invention relates generally to an electronic system and method, and, in particular embodiments, to a real-time update method for a differential memory, differential memory and electronic system.

BACKGROUND

As is known, electronic control units of vehicles include a memory designed to store a vehicle-control software.

Further known is the need to test a number of versions of the software and thus alternate execution of different versions until a final version is selected.

It is common practice to use a plurality of memories, each memory being designed to store each version of the software to be tested. Alternatively, it is possible to use a memory of a size such as to store each version of the software to be tested. This entails an increase in the costs.

The above problem is particularly felt in the case of use of memories of a differential type, where two memory cells of opposite state are associated to each information bit. Reading architectures of a differential type afford advantages in terms of reliability, in so far as the datum is stored in a redundant way; reading is carried out by comparing the data contained in the two memory cells of opposite state.

A class of memory of a differential type is the phase-change memory (PCM), where, in particular, reading is made by comparing respective currents that flow in the cells associated to a same information bit.

SUMMARY

Some embodiments relate to a method for managing a differential memory, a differential memory, and a system that comprises the differential memory. Some embodiments relate to a method for real-time updating of a differential memory with continuous reading accessibility by a user.

In an embodiment, a method for real-time management of a differential memory includes: storing first logic data associated with a first informative content in an auxiliary memory module of the differential memory, the first logic data being stored in a first submodule of a main memory module; storing third logic data associated with a second informative content in a second submodule of the main memory module of the differential memory by overwriting second logic data associated with the first informative content, while maintaining the first logic data contained in the first submodule of the main memory module unaltered, where the second logic data are complementary to the first logic data; receiving a request for reading the first informative content; when the third logic data is being stored, reading the first logic data from the auxiliary memory module in a single-ended mode in response to the request for reading the first informative content; when the third logic data is not being stored, reading the first logic data from the first submodule in response to the request for reading the first informative content; receiving a request for reading the second informative content; and reading the third logic data in single-ended mode in response to the request for reading the second informative content.

In another embodiment, a differential memory includes: a first submodule configured to store first logic data and a second submodule configured to store second logic data that is complementary to the first logic data; an auxiliary memory module; and a controller configured to: control a storage operation of the first logic data in the auxiliary memory module; control a storage operation of third logic data, associated with a second informative content, in the second submodule by overwriting the second logic data while maintaining the first logic data contained in the first submodule unaltered; receive a request for reading the first informative content; when the third logic data is being stored, read the first logic data from the auxiliary memory module in single-ended mode in response to the request for reading the first informative content; when the third logic data is not being stored, read the first logic data from the first submodule in response to the request for reading the first informative content; receive a request for reading the second informative content; and read the third logic data in single-ended mode in response to the request for reading the second informative content.

In yet another embodiment, a differential memory includes: a first main memory module including a first submodule configured to store first logic data and a second submodule configured to store second logic data that is complementary to the first logic data, the first and second submodules being the same size; an auxiliary memory module; and a controller configured to: read and rewrite the first logic data in the first submodule; control a storage operation of the first logic data in the auxiliary memory module; control a storage operation of third logic data, associated with a second informative content, in the second submodule by overwriting the second logic data while maintaining the first logic data contained in the first submodule unaltered; receive a request for reading the first informative content; when the third logic data is being stored, read the first logic data from the auxiliary memory module in single-ended mode in response to the request for reading the first informative content; when the third logic data is not being stored, read the first logic data from the first submodule in response to the request for reading the first informative content; receive a request for reading the second informative content; and read the third logic data in single-ended mode in response to the request for reading the second informative content.

In yet another embodiment, a method for managing a PCM differential memory that is arranged in two branches and configured to enable differential reading of a first informative content stored in complementary form in the two branches includes the steps of: storing a second informative content in one of the two branches, preserving the data regarding the first informative content in the other branch; using an auxiliary module for temporarily storing the first informative content, and enabling storage of the second informative content without interrupting access in reading to the first informative content; and reading in asymmetrical, or single-ended, mode the first or second informative content.

BRIEF DESCRIPTION OF THE DRAWINGS

For a better understanding of the present invention, preferred embodiments thereof are now described, purely by way of non-limiting example, with reference to the attached drawings, wherein:

FIG. 5 shows an electronic system that includes the nonvolatile-memory device of FIG. 1.

DETAILED DESCRIPTION OF ILLUSTRATIVE EMBODIMENTS

Figure 1:
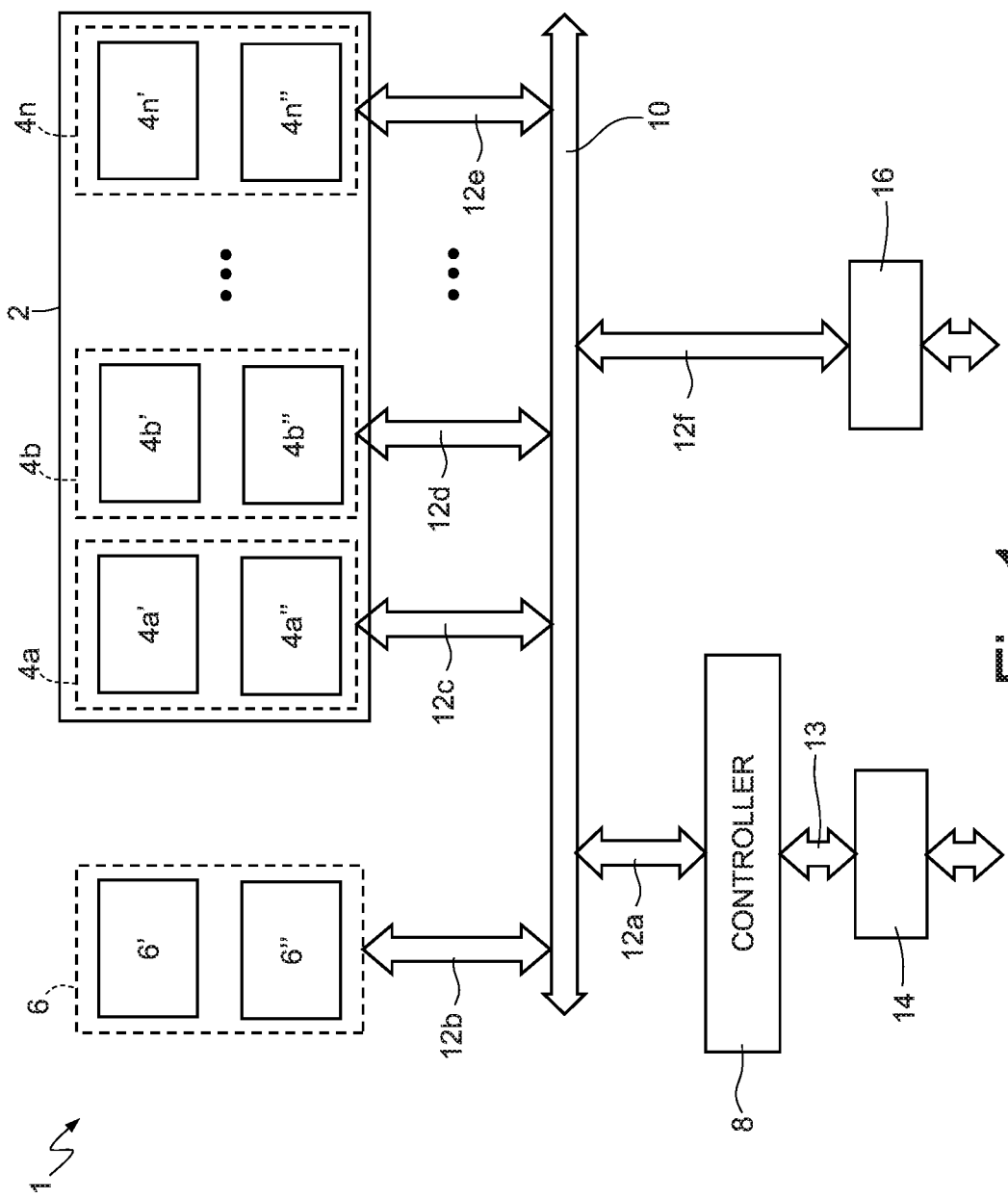
FIG. 1 is a schematic illustration of a portion of a nonvolatile memory device according to one embodiment of the present invention.

Represented schematically in FIG. 1 and designated as a whole by the reference number 1 is a portion of a memory device, in particular a nonvolatile memory. According to an embodiment of the present invention, the memory 1 is of a differential type, in particular of a PCM type. The nonvolatile-memory device 1 is shown limitedly to just the parts necessary for an understanding of the present disclosure.

In a known way, phase-change memories (PCMs) of a differential type are typically designed according to a scheme with an array of memory cells arranged in rows (word lines) and columns (bit lines). Each memory cell is provided by a phase-change storage element and by a selector transistor, connected in series. A column decoder and a row decoder enable selection, on the basis of address logic signals received at input and more or less complex decoding schemes, of the memory cells, and, in particular, the corresponding word lines and bit lines, each time addressed.

The column decoder comprises a plurality of analog selection switches (provided by transistors), which receive at their respective control terminals the address signals. The selection switches are arranged according to a tree structure in hierarchical levels, and their number at each hierarchical level is linked to the arrangement and size of the memory array. The selection switches, when enabled, make it possible to bring the bit line selected to a definite value of voltage and/or current, according to the operations that it is desired to implement. In particular, a current path is created between a programming stage or a reading stage and the bit line selected. This current path is defined by the series of a certain number of selection switches. In a known way, sense amplifiers carry out reading of the data stored in the memory cells, comparing the current that flows in the memory cell selected (or an electrical quantity correlated thereto) with a reference current supplied by a reference-current generator (so-called asymmetrical or single-ended reading) and/or by one or more reference cells, used for the entire memory array. In the prior art, single-ended reading is typically used during verification that programming of the cell has occurred or during testing. During normal use of the memory, reading of a double-ended type is instead used, in which the sense amplifiers compare the current flowing in the memory cell selected with the current flowing in a respective cell associated to the memory cell selected in the differential architecture.

To carry out single-ended reading, an input of the sense amplifier receives the current of the memory cell that is to be read, while the other input of the sense amplifier receives the reference current supplied by the reference-current generator.

In single-ended mode, it is possible to read and write independently two memory cells that are normally associated in order to carry out differential reading. In effect, when it is operated in single-ended mode, each memory cell may have a value independent of the value of the other memory cells, and it is consequently possible to double the amount of data that may be stored in the PCM.

In particular, the nonvolatile-memory device 1 comprises a memory array 2, constituted by a plurality of "n" main memory modules 4a-4n. Each main memory module 4a-4n comprises a first submodule 4a'-4n' and a second submodule 4a"-4n". In particular, each first submodule 4a'-4n' comprises a plurality of memory cells, and each second submodule 4a"-4n" comprises a plurality of respective memory cells.

In a per se known manner and not shown in FIG. 1, the plurality of first memory cells stores respective logic data of a binary type. The plurality of second memory cells corresponds, as regards number and manufacturing characteristics, to the plurality of first memory cells and is configured to store respective logic data complementary to the logic data stored in the respective plurality of first memory cells so as to enable differential reading of the logic data.

In any case, each main memory module 4a-4n may be used in single-ended mode, such that the logic data stored in the plurality of memory cells of each second submodule 4a"-4n" are not complementary to the logic data stored in the plurality of memory cells of the respective first submodule 4a'-4n', but are further information data. In this way, it is possible to double the total capacity of the memory array 2.

The nonvolatile-memory device 1 further comprises an auxiliary memory module 6. In particular, the auxiliary memory module 6 structurally and operatively corresponds to each main memory module 4a-4n, and is thus formed by a first submodule 6' and a second submodule 6". In particular, the first submodule 6' comprises a plurality of memory cells, and the second submodule 6" comprises a plurality of respective memory cells, which may be addressed and thus used in single-ended mode.

In addition, the nonvolatile-memory device 1 comprises a controller 8, operatively coupled to the memory array 2 and to the auxiliary memory module 6. The controller 8 is configured to implement a method of reading and writing logic data in the memory array 2 and in the auxiliary memory module 6.

Furthermore, the nonvolatile-memory device 1 comprises a bus 10. The controller 8, the main memory modules 4a-4n, and the auxiliary memory module 6 are each coupled to the bus 10 by respective communication lines 12a-12e so as to enable, as described in greater detail hereinafter, a transfer of data and control signals between the controller 8, the main memory modules 4a-4n, and the auxiliary memory module 6.

Further, the nonvolatile-memory device 1 comprises a controller interface 14. The controller interface 14 is coupled to the controller 8 so as to send to the controller 8, via a communication line 13, logic data to be written in the memory array 2.

In addition, the nonvolatile-memory device 1 comprises a memory-array interface 16. The memory-array interface 16 is coupled to the bus 10 via a respective communication line 12f. A user of the nonvolatile-memory device 1 may gain access, for example in reading, to the data stored in the nonvolatile-memory device 1 via the memory-array interface 16. The user is, for example, a microprocessor, a DSP, or a microcontroller.

Figure 2:
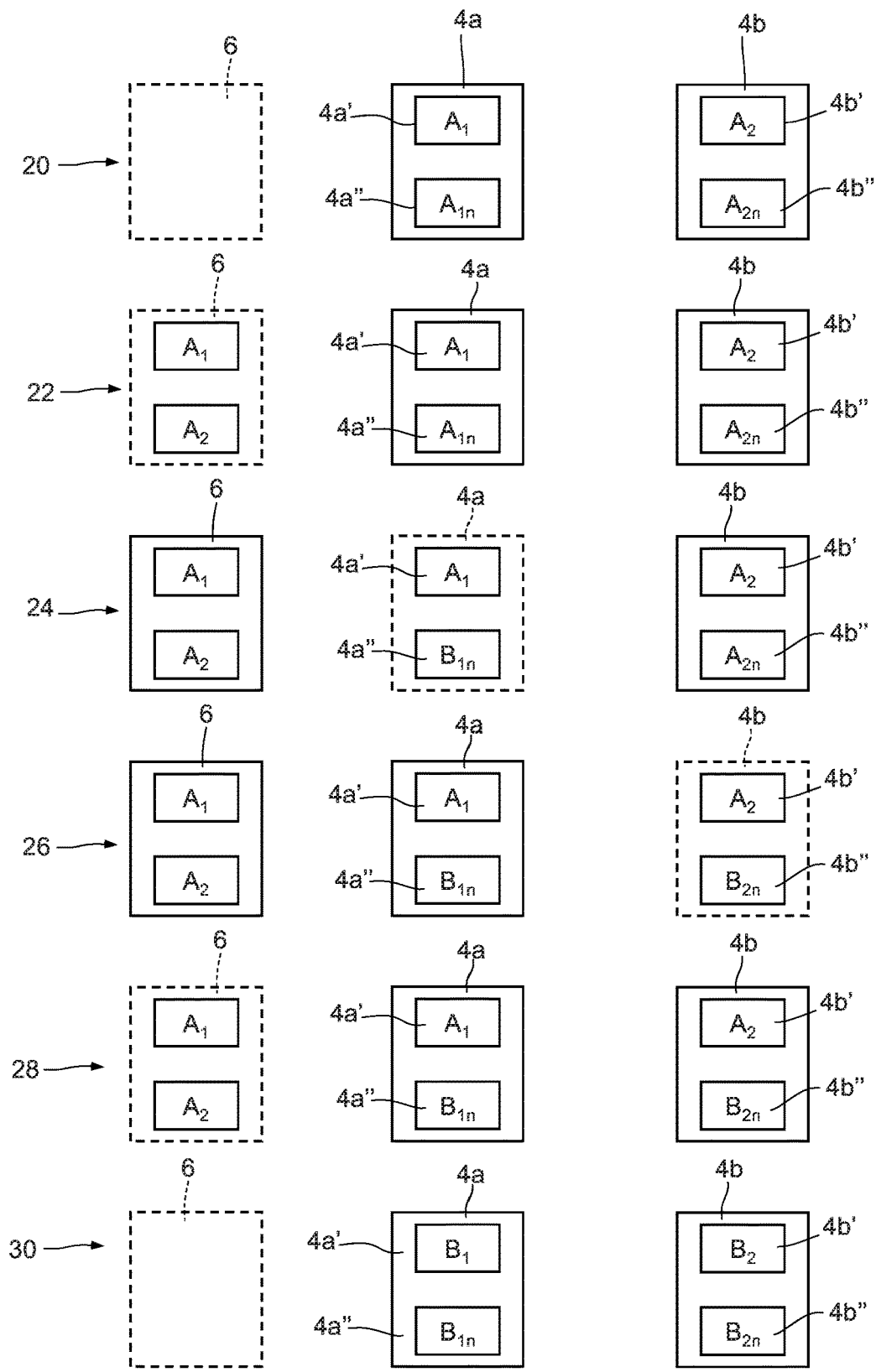
FIG. 2 shows schematically, by a block diagram, a method for managing the nonvolatile-memory device of FIG. 1.

FIG. 2 shows schematically, by a block diagram, a method for managing the memory array 2. In particular, by way non-limiting example, FIG. 2 regards a memory array 2 in which a first main memory module 4a and a second main memory module 4b are present. In other embodiments, the number of main memory modules could be different.

In an initial step 20, the memory array 2 contains a first set of data A, stored in a differential way. In particular, the first set of data A includes a first datum A1, a second datum A2, and the respective complementary data A1n, A2n. For instance, each of the first and second data A1, A2 and the respective complementary data A1n, A2n is a single bit or a set of bits having a size, for example, of 32 MB.

In particular, the first main memory module 4a contains the first datum A1 and the respective complementary datum A1n, and the second main memory module 4b comprises the second datum A2 and the respective complementary datum A2n. In particular, the first datum A1 is stored in the first submodule 4a' of the first main memory module 4a; the second datum A2 is stored in the first submodule 4b' of the second main memory module 4b; the datum A1n complementary to the first datum A1 is stored in the second submodule 4a" of the first main memory module 4a; the datum A2n complementary to the second datum A2 is stored in the second submodule 4b" of the second main memory module 4b.

In the initial step 20, the user of the nonvolatile-memory device 1 has access to the first set of data A, which may be read in a differential way from the first and second main memory modules 4a, 4b.

The contents of the auxiliary memory block 6, which is represented empty in FIG. 2, are irrelevant in the initial step 20 of the management method. The user of the nonvolatile-memory device 1 does not have access to the data stored in the auxiliary memory block 6, which is for this reason illustrated with a dashed line.

After step 20, control passes to step 22 where each of the first and second data A1, A2 is written in the auxiliary memory module 6 by the controller 8, as described in detail hereinafter.

During step 22, the user of the nonvolatile-memory device 1 continues to have access to the first set of data A, which may be read in a differential way from the first and second main memory modules 4a, 4b.

After step 22, control passes to steps of writing a second set of data B in the first and second main memory modules 4a, 4b.

In particular, the second set of data B includes a first datum B1n and a second datum B2n. For instance, in a way similar to what has been described with reference to the first set of data A, each of the first and second data B1n, B2n is a single bit or a set of bits having a size, for example, of 32 MB.

In particular, after step 22 control passes to step 24, where the datum B1n is written in the second submodule 4a" of the first main memory module 4a.

During step 24, the contents of the first main memory module 4a are not accessible in reading for the user in so far as the module is occupied in the operation of writing of the datum B1n. For this reason, it is illustrated with a dashed line.

In any case, during step 24, the user of the nonvolatile-memory device 1 continues to have access to the informative content associated to the first set of data A in so far as it is possible to read the first datum A1 in the auxiliary memory module 6, and the second datum A2 in the second main memory module 4b.

After step 24 control passes to step 26, where the datum B2n is written in the second submodule 4b" of the second main memory module 4b.

During step 26, the contents of the second main memory module 4b are not accessible in reading in so far as the module is occupied in the operation of writing of the datum B2n. For this reason, it is illustrated with a dashed line.

In any case, during step 26, the user of the nonvolatile-memory device 1 continues to have access to the informative content associated to the first set of data A in so far as it is possible to read the first datum A1 in the first main memory module 4a and the second datum A2 in the auxiliary memory module 6.

After step 26, control passes to step 28, where the second main memory module 4b is rendered again accessible to the user. During step 28, the contents of the auxiliary memory module 6 are not accessible and are irrelevant, and for this reason the module is illustrated with a dashed line.

During step 28, the user of the nonvolatile-memory device 1 continues to have access to the informative content associated to the first set of data A in so far as it is possible to read the first datum A1 in the first main memory module 4a and the second data A2 in the second main memory module 4b.

During step 28, the user of the nonvolatile-memory device 1 has further access to the informative content associated to the second set of data B in so far as it is possible to read the datum B1n in the first main memory module 4a and the datum B2n in the second main memory module 4b.

For instance, the informative content associated to the first set of data A is a first vehicle-control software. In this case, the nonvolatile-memory device 1 is embedded in an electronic control unit of the vehicle. In addition, the informative content associated to the second set of data B is a second vehicle-control software.

During step 28, it is possible to carry out alternatively the first or second vehicle-control software.

For instance, during step 28 it is possible to evaluate the performance of the vehicle during use of the first control software, and alternately, of the second control software, until the most adequate control software is determined.

Once step 28 is through, control passes to step 30, where the control software deemed adequate is stored in a differential way in the memory array 2. For instance, in the case of FIG. 2, the control software deemed adequate is that associated to the second set of data B.

Consequently, after step 28, a datum B1 complementary to the datum B1n is written in the first submodule 4a' of the first main memory module 4a, and a datum B2 complementary to the datum B2n is written in the first submodule 4b' of the second main memory module 4b, to arrive at the configuration illustrated in step 30. The auxiliary memory module 6 is shown with a dashed line, in so far as, at the end of the steps of the method described previously, the auxiliary memory module 6 is not used and its informative content is irrelevant.

The steps 22-26 of the management method are carried out for all "n" main memory modules 4a-4n, as illustrated previously for the case of the two main memory modules 4a, 4b.

Figure 3:
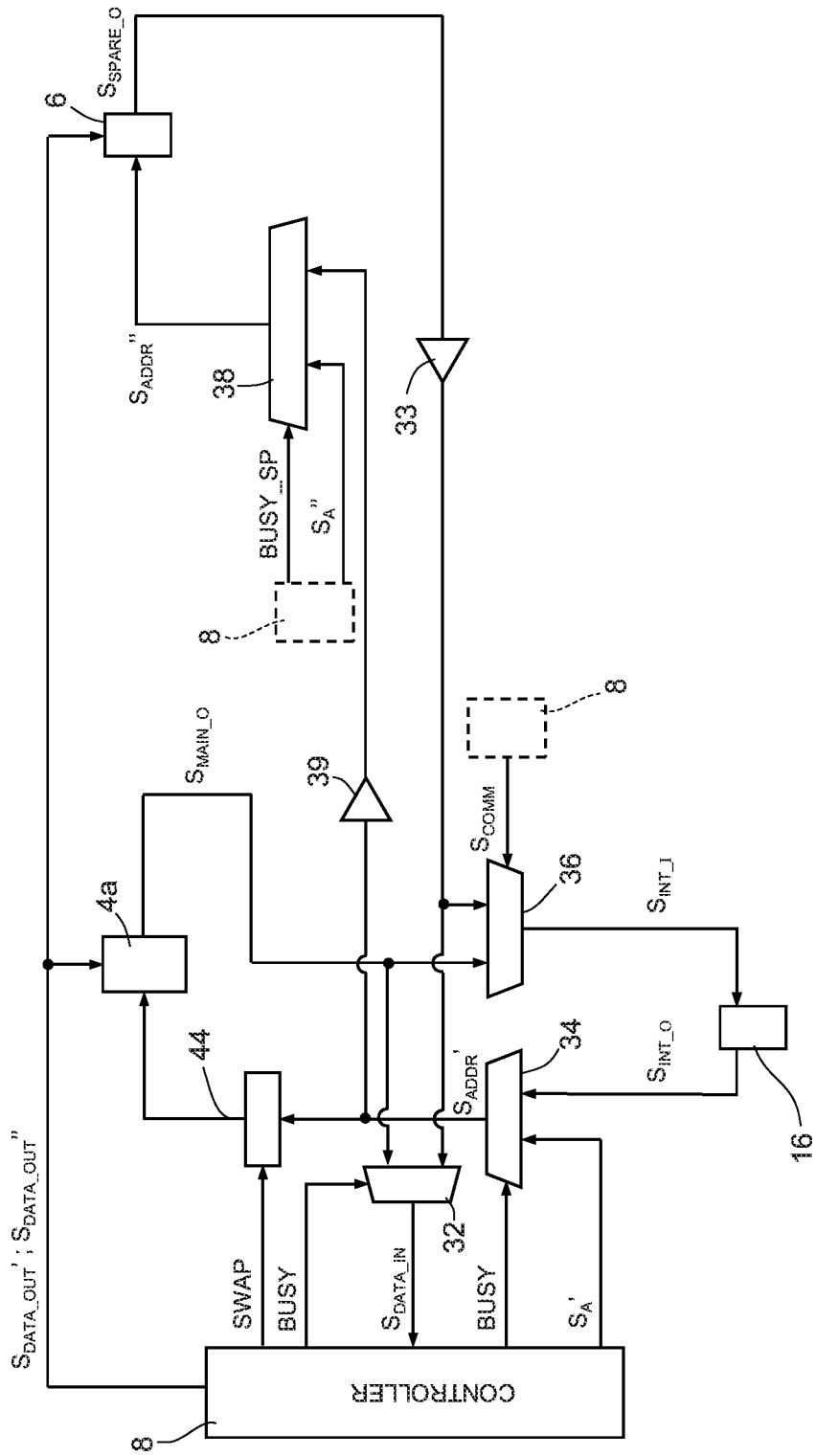
FIG. 3 shows an electrical circuit corresponding to a portion of the nonvolatile-memory device of FIG. 1, included in the portion of FIG. 1.

FIG. 3 shows in greater detail a portion of the nonvolatile-memory device 1 of FIG. 1, comprising the main memory module 4a, the auxiliary memory module 6, the controller 8, and the memory-array interface 16. In particular, the nonvolatile-memory device 1 further comprises a plurality of multiplexers designed to render transparent management of the first and second sets of data A, B for the user of the nonvolatile-memory device 1.

The controller 8 is further configured to generate a first control signal BUSY, a second control signal BUSY_SP, and a third control signal SCOMM for controlling the plurality of multiplexers described more fully hereinafter.

The controller 8 is further configured to receive data contained in the main memory module 4a and in the auxiliary memory module 6 via an input signal SDATA_IN. In particular, the signal SDATA_IN is one of the signals SMAIN_O (which carries the data contained in the main memory module 4a) and SSPARE_O (which carries the data contained in the auxiliary memory module 6) selected via a multiplexer 32 controlled by the first control signal BUSY. For this purpose, the multiplexer 32 is coupled to the main memory module 4a and to the auxiliary memory module 6 for receiving, respectively, the signal SMAIN_O and the signal SSPARE_O. For instance, the signal SSPARE_O is read after an operation of writing in the auxiliary memory module 6 in order to verify that the writing operation has been carried out correctly. Otherwise, according to known procedures, subsequent writing operations of the same datum are carried out until the datum has been written correctly.

In particular, the multiplexer 32 is coupled to the auxiliary memory module 6 via interposition of a first buffer 33 so as to reduce the propagation times associated to the auxiliary memory module 6.

The controller 8 is further configured to send to the main memory module 4a an output signal SDATA_OUT' that carries data that may be stored in the main memory module 4a, and to send to the auxiliary memory module 6 an output signal SDATA_OUT" that carries data that may be stored in the auxiliary memory module 6.

The controller 8 is further configured to generate a signal SA', which contains an address of one of the memory cells of the main memory module 4a. The signal SA' is supplied to an input of a multiplexer 34 controlled by the first control signal BUSY. The multiplexer 34 further receives a signal SINT_O from the memory-array interface 16, which contains an address for carrying out an operation of reading or writing on one of the memory cells of the main memory module 4a. The first control signal BUSY enables selection of one of the input signals SA', SINT_O in order to generate an output signal SADDR' to the multiplexer 34.

The signal SADDR' is supplied to the main memory module 4a for addressing one of the memory cells of the main memory module 4a.

According to one aspect of the present invention, an address-management block 44 is arranged between the multiplexer 34 and the main memory module 4a. The controller 8 is further configured to generate a control signal SWAP, designed to control the address-management block 44. Consequently, the address-management block 44 receives at input the signal SADDR' and the control signal SWAP. In particular, if the control signal SWAP has logic value "0," the signal SADDR' is directly supplied to the main memory module 4a. Otherwise, if the control signal SWAP has logic value "1," the signal SADDR' is modified so as to address the memory cell complementary to the memory cell originally addresses. Typically, in differential memories, the address of a memory cell and that of its complementary are separated by a fixed offset equal to the size of the memory cell. In this case, the address-management block 44 is configured to add the offset to the address indicated by the signal SADDR' in the case where the control signal SWAP has logic value "1."

Consequently, the signal SMAIN_O at output from the main memory module 4a contains data corresponding to the data contained in the memory cell, addressed by the signal SADDR', of the main memory module 4a if the control signal SWAP has logic value "0," or alternatively the data contained in the complementary memory cell if the control signal SWAP has logic value "1." In this way, it is possible to access, during step 28 of the management method, both the informative content associated to the set of data A and to that associated to the set of data B. In addition, it is possible to execute each of the control software corresponding to the set of data A and to the set of data B with reference to a same memory-address region, namely, the one for which each of the control software has been compiled and linked even though the set of data B physically resides in a different memory-address region.

The aforesaid signal SMAIN_O is further supplied to a multiplexer 36 controlled by the third control signal SCOMM. The multiplexer 38 further receives at input the signal SSPARE_O from the auxiliary memory module 6 via interposition of the first buffer 33. The multiplexer 38 selects one of the signals SMAIN_O, SSPARE_O in order to generate a signal SINT_I at input to the memory-array interface 16. The signal SINT_I consequently contains data sent in response to reading requests from the user. These data come from the main memory module 4a or from the auxiliary memory module 6.

The controller 8 is further configured to generate a signal SA", which contains an address of one of the memory cells of the auxiliary memory module 6. The signal SA" is supplied to an input of a multiplexer 38 controlled by the second control signal BUSY_SP. The multiplexer 38 further receives at input the signal SADDR' via interposition of a second buffer 39 so as to reduce the propagation times associated to the auxiliary memory module 6. The second control signal BUSY_SP enables selection of one of the input signals SA", SADDR' for generating a signal SADDR" at output from the multiplexer 38. In particular, the output signal SADDR" corresponds to the input signal SA" during copying of the data of the main memory module 4a into the auxiliary memory module 6 (step 22 of the management method of FIG. 2), and to the input signal SADDR'=SINT_O in the case where the user requests reading of the informative content of the memory cell 4a during writing of the datum B1n in the main memory module 4a (step 24 of the management method of FIG. 2).

In a per se known manner, the controller 8 and the main memory module 4a receive at input respective clock signals generated by clock generators not shown in FIG. 3. Further, a multiplexer (not shown in the figure either) may be arranged between the main memory module 4a and the aforesaid clock generators for synchronizing the main memory module 4a to the controller 8.

It is evident that the second main memory module 4b is structurally equivalent to the first main memory module 4a of FIG. 3, and is operatively coupled to the controller 8, to the auxiliary memory module 6, and to the memory-array interface 16 via respective multiplexers.

In addition, the second main memory module 4b may be associated to a respective clock signal, for example different from the clock signal of the first main memory module 4a.

In order to describe in greater detail some steps of the management method FIG. 2, each of FIGS. 4A-4E shows the portion of the nonvolatile-memory device 1 of FIG. 3 during a different step of the method. In each of FIGS. 4A-4E, communication lines corresponding to signals that are active in the corresponding step of the method are highlighted with the use of thick lines, where by "active signals" are meant signals that carry data during this step and signals that carry addresses of the data.

Figure 4A:
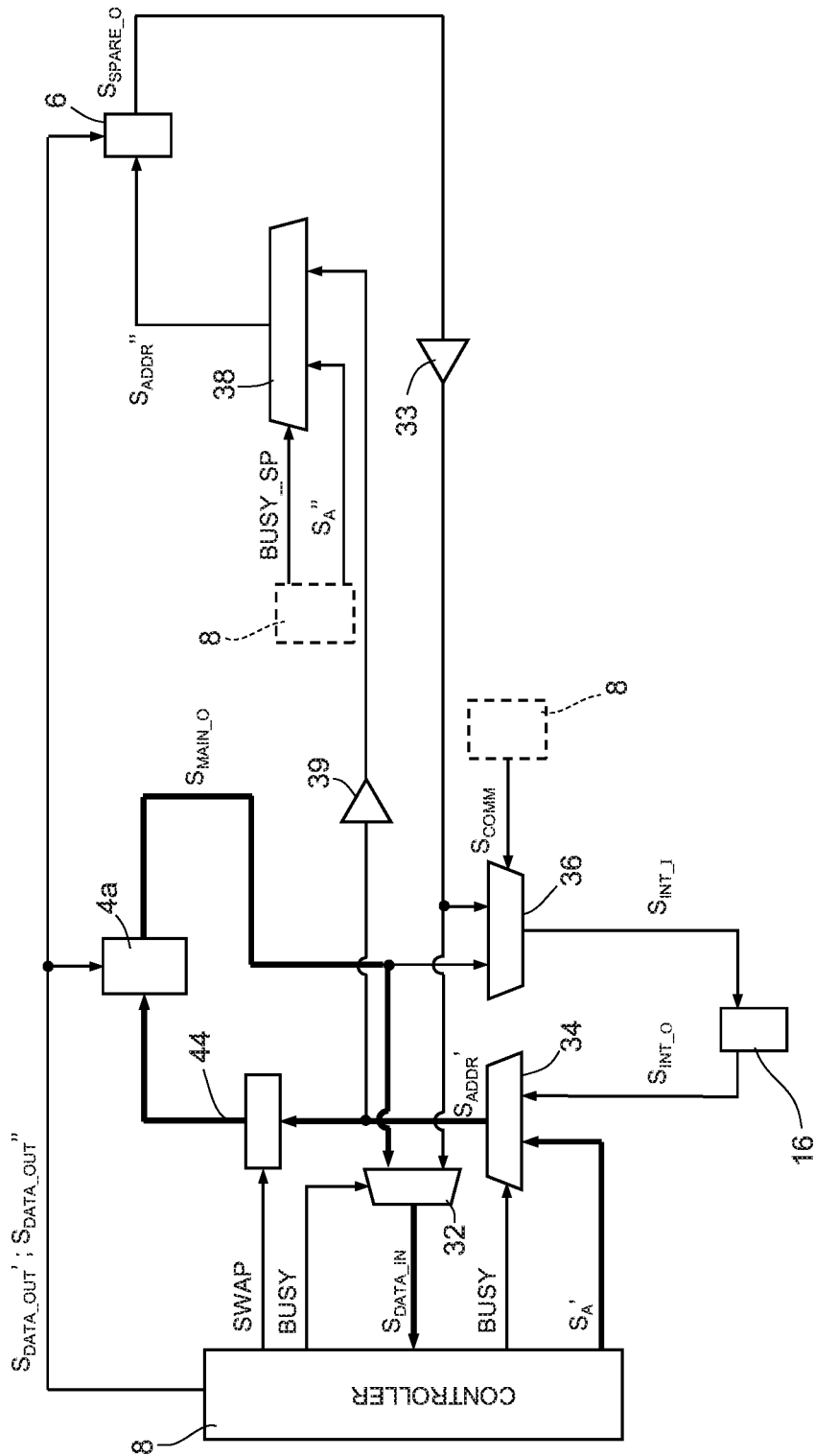
FIGS. 4A-4E show the circuit of FIG. 3 in respective steps of the method of FIG. 2, where circuit connections of particular importance for implementation of the respective step of the method are highlighted by thick lines.
Figure 4B:
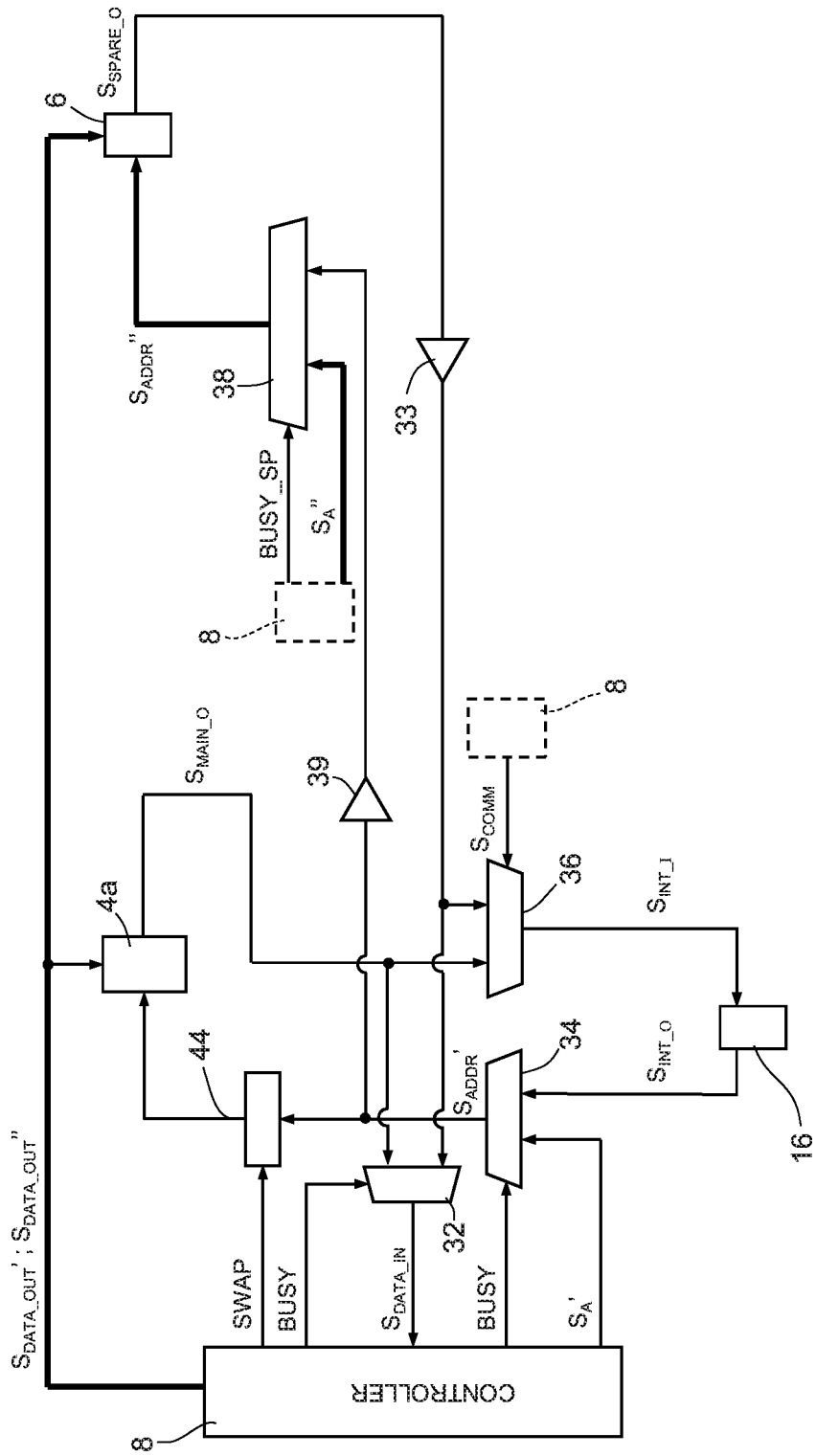

In particular, FIGS. 4A and 4B regard step 22 of the method, where the first datum A1 is written in the auxiliary memory module 6.

In even greater detail, FIG. 4A regards a first sub-step of step 22, where the controller 8 reads the datum A1 from the main memory module 4a. In the course of the sub-step of FIG. 4A, the controller 8 generates the first control signal BUSY so as to select the signals SMAIN_O and SA', which are thus supplied at output by the respective multiplexers 32, 34, respectively, via the signals SDATA_IN and SADDR'. In this way, the controller 8 receives at input the signal SDATA_IN, corresponding to the datum A1, contained in the memory cell addressed by the signal SA' and contained in the main memory module 4a.

In the course of the sub-step of FIG. 4A, the control signal SWAP has logic value "0," so that the main memory module 4a will receive the unaltered signal SADDR', which thus corresponds to the signal SA'.

FIG. 4B regards a second sub-step of step 22 of the method, after the first sub-step of FIG. 4A, where the controller 8 writes in the auxiliary memory module 6 the datum A1 read in the course of the sub-step of FIG. 4A.

In the course of the sub-step of FIG. 4B, the controller 8 generates the second control signal BUSY_SP so as to select the signal SA", which is then supplied at output by the multiplexer 38 via the signal SADDR". Furthermore, the controller 8 sends to the auxiliary memory module 6 the output signal SDATA_OUT", which contains the datum A1 to be written in the memory cell of the auxiliary memory module 6 addressed by the signal SADDR"=SA". The signal SA" supplied by the controller 8 in the course of the sub-step of FIG. 4B contains the same address contained in the signal SA' supplied by the controller 8 in the course of the sub-step of FIG. 4A.

Consequently, at the end of the sub-step of FIG. 4B, the datum A1 is stored in the auxiliary memory module 6 at the same address as the one to which it is associated in the main memory module 4a.

It is evident that the second datum A2 is read from the second main memory module 4b and written in the auxiliary memory module 6 as has been described with reference to the first datum A1 and to the first main memory module 4a and illustrated in FIGS. 4A and 4B.

Figure 4C:
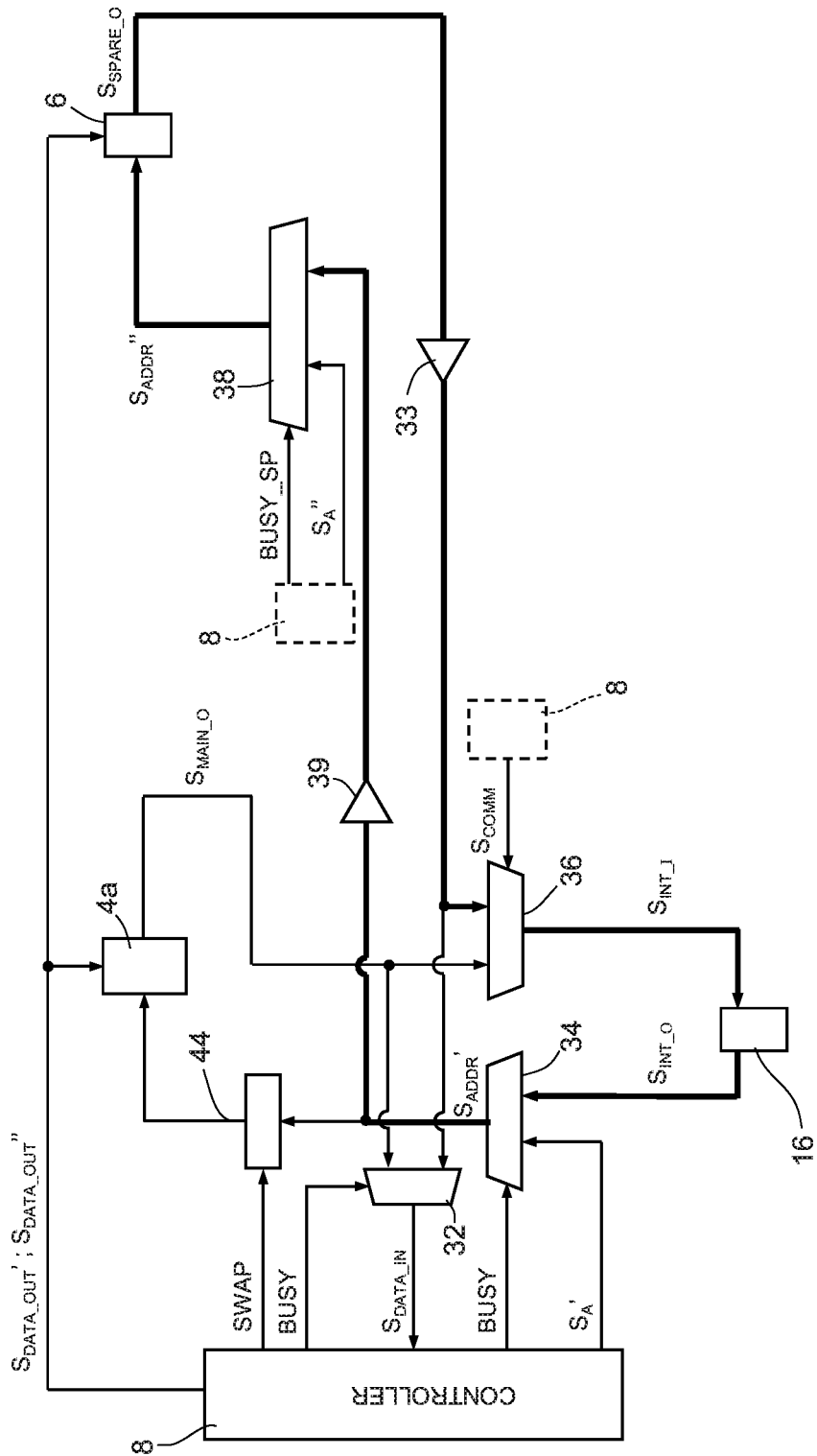
Figure 4D:
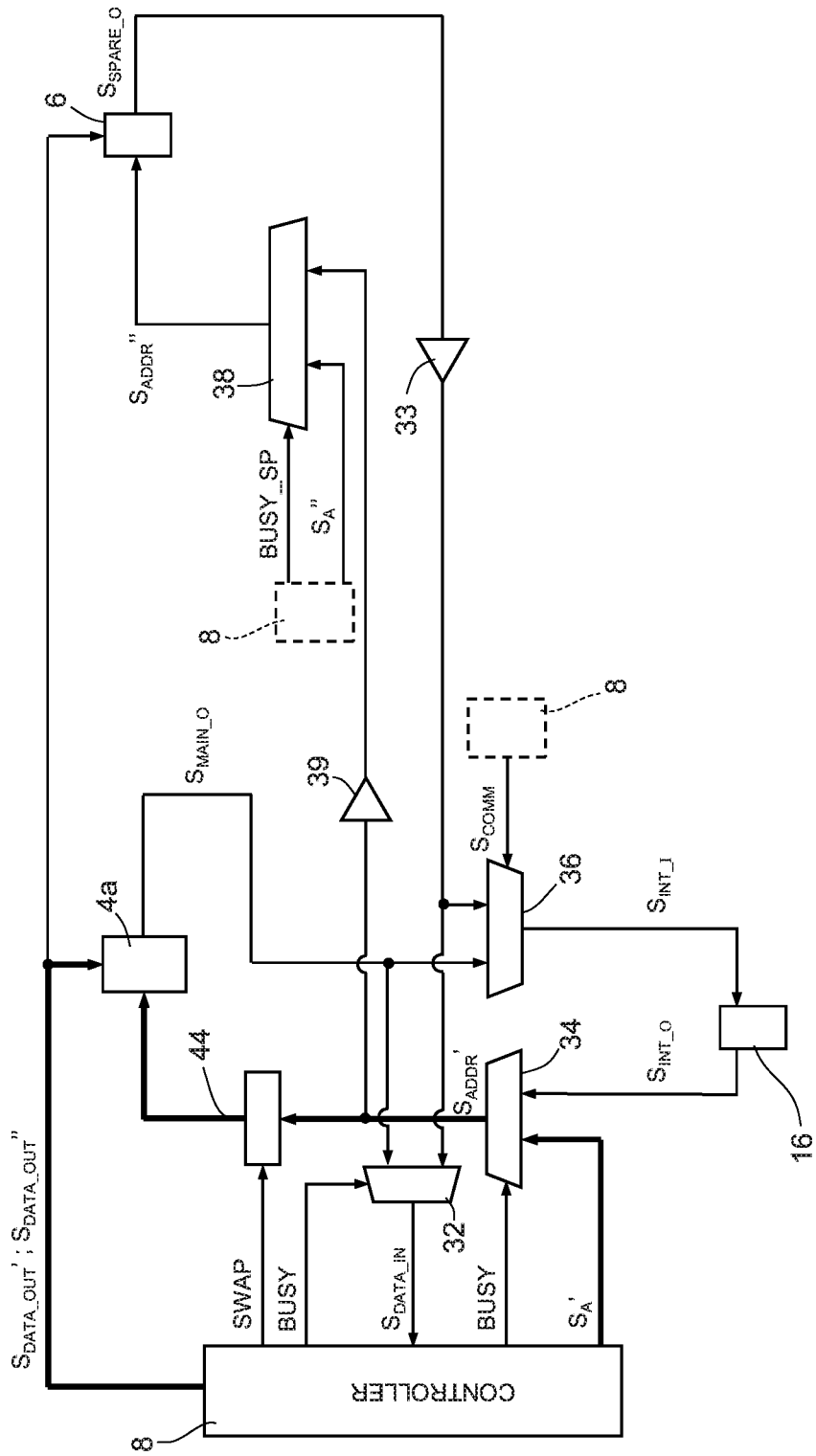

FIGS. 4C and 4D regard step 24 of the method, where the datum B1n is written in the first main memory module 4a, and requests of reading of the datum A1 by the user are re-addressed to the auxiliary memory module 6.

In particular, FIG. 4C illustrates an operation of reading by the user of an informative content of the main memory module 4a, re-addressed to the auxiliary memory module 6.

During step 24, the controller 8 generates the second control signal BUSY_SP so as to select the signals SINT_O, SADDR', which are thus supplied at output by the respective multiplexers 34, 38. In addition, the controller 8 generates the third control signal SCOMM so as to select the signal SSPARE_O, supplied at output by the multiplexer 36. In this way, whenever during step 24 the user asks to read the datum A1, associated to the memory cell of the main memory module 4a addressed by the signal SINT_O, the datum contained in the memory cell of the auxiliary memory module 6 addressed by the signal SADDR"=SADDR'=SINT_O is read. This datum, supplied at output by the auxiliary memory module 6 via the signal SSPARE_O, is then sent to the memory-array interface 16 via the signal SINT_I.

FIG. 4D illustrates a sub-step of writing of the datum B1n in the second submodule 4a" of the main memory module 4a, carried out during step 24, after the sub-step of FIG. 4C.

The datum B1n is, for example, supplied to the controller 8 by the controller interface 14 of FIG. 1.

During the sub-step of FIG. 4D, the controller 8 generates the first control signal BUSY so as to select the signal SA', which is then supplied at output by the multiplexer 34 so as to indicate the address of writing of the datum B1n. For instance, writing address of the datum B1n may point to the second submodule 4a" of the first main memory module 4a. In this case, the logic value of the control signal SWAP is "0." Alternatively, the writing address of the datum B1n may point to the first submodule 4a' of the first main memory module 4a. In this case, the logic value of the control signal SWAP is "1" and consequently, after applying the fixed offset to the signal SADDR' at output from the address-management block 44, the datum B1n is in any case written in the second submodule 4a".

It is evident that step 26 of the method, where the datum B2n is written in the second main memory module 4b and requests of reading of the datum A2 by the user are re-addressed to the auxiliary memory module 6, is carried out in a way similar to what has been illustrated in FIGS. 4C and 4D with reference to the datum B1n, to the datum A1, and to the first main memory module 4a.

Figure 4E:
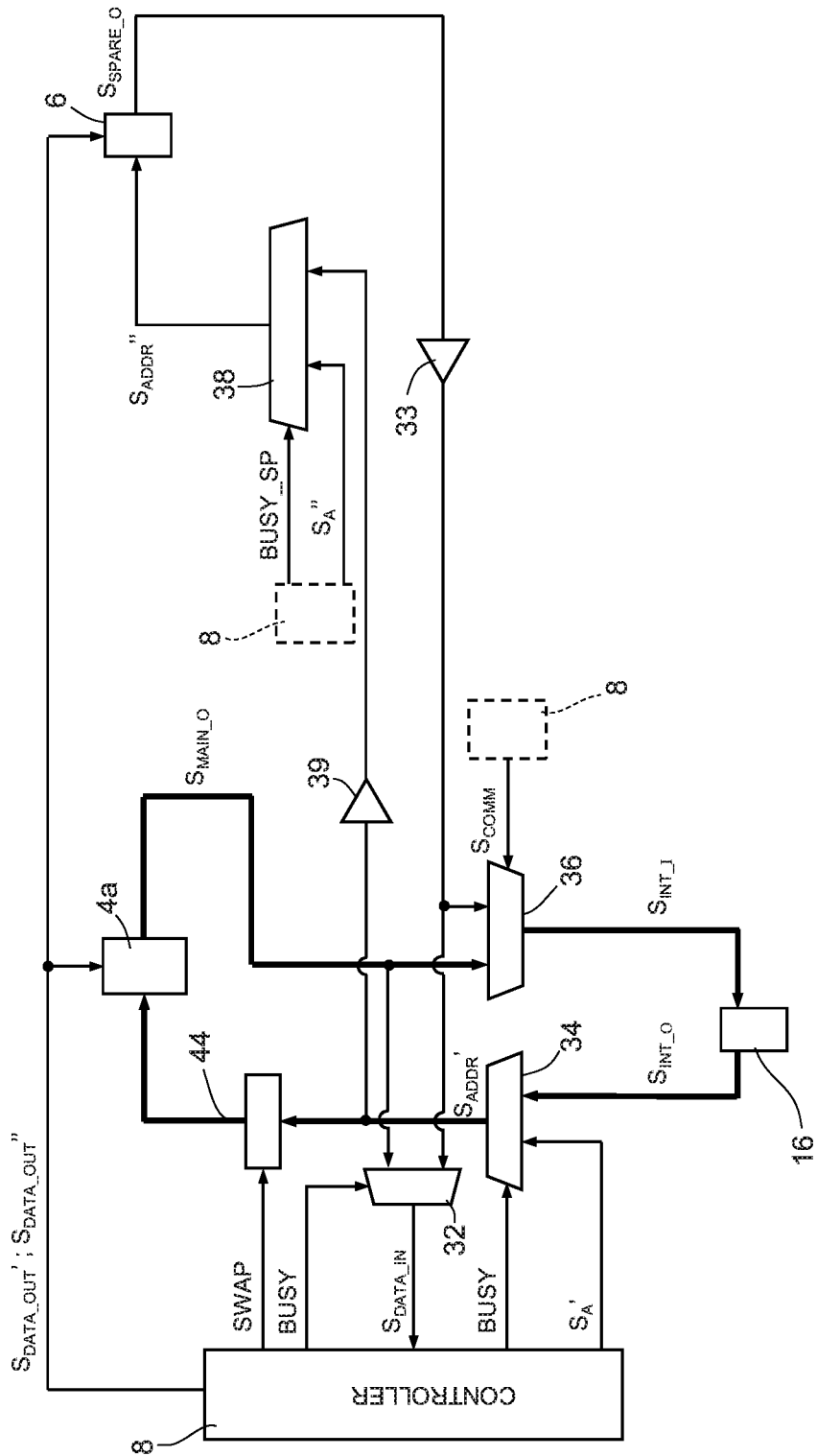

FIG. 4E regards step 28 of the management method, where the user may access the set of data A (for example, the first vehicle-control software) or alternatively the set of data B (in this example, the second vehicle-control software). In particular, FIG. 4E illustrates an operation of reading by the user of an informative content of the first main memory module 4a.

During step 28, the controller 8 controls the multiplexers 34 and 36 so as to select and supply at output, respectively, the signals SINT_O and SMAIN_O. In this way, in the case where during step 28 the user requests reading of the informative content of the main memory module 4a associated to the memory cell addressed by the signal SINT_O, the datum A1 is read if the control signal SWAP has logic value "0," and the datum B1n is read if the control signal SWAP has logic value "1." Consequently, in the case where the user has to use the first control software, the control signal SWAP has logic value "0." Otherwise, the control signal SWAP has logic value "1." In any case, the datum read, supplied at output by the first main memory module 4a via the signal SMAIN_O, is sent to the memory-array interface 16 via the signal SINT_I.

FIG. 5 illustrates a portion of an electronic system 50 according to an embodiment of the present invention. The electronic system 50 may be used in electronic devices, such as: an electronic control unit of a vehicle; a PDA (Personal Digital Assistant); a portable or fixed computer, possibly with capacity of wireless data transfer; a mobile phone; a tablet; a smartphone; a digital audio player; a photographic or video camera; or further devices that are able to process, store, transmit, and receive information.

In detail, the electronic system 50 comprises a controller 51 (for example, provided with a microprocessor, a DSP, or a microcontroller) and the nonvolatile-memory device 1 described previously. Optionally, the electronic system 50 comprises one or more from among an input/output device 52 (for example, provided with a keypad and a display) for input and display data, a wireless interface 54, for example, an antenna for transmitting and receiving data through a radio-frequency wireless-communication network, and a RAM 55, all coupled through a bus 56. A battery 57 may be used as electrical supply source in the electronic system 50, which may further be provided with a photographic or video camera 58.

According to a further embodiment (not illustrated in the figures), the nonvolatile-memory device 1 may be embedded in the controller 51.

In any case, the present invention finds application in an operating condition where the electronic system 50 is controlled by the first control software, and the second control software is written in the nonvolatile-memory device 1, without interrupting execution of the first control software.

For instance, writing of the second control software is carried out using over-the-air methodology.

From an examination of the characteristics of the invention described and illustrated herein, the advantages that it affords are evident.

In particular, the user has an uninterrupted access in reading to the informative content of the set of data A during writing of the set of data B, and further, at the end of writing of the set of data B, may access alternatively the set of data A or the set of data B without any need to provide an additional memory module dedicated to storage of the set of data B. Consequently, it is possible to store twice the amount of the data as compared to differential memories of a conventional type and having the same amount of main memory modules.

Furthermore, it is possible to execute a software corresponding to the set of data B compiled and linked as if it physically resided in the memory region occupied by the set of data A. In this way, there is no need to specify in an image of the software, contained in the set of data B, its physical location in the memory. In particular, in a context where a number of versions of the software are tested, typically the sequence of updates of the versions of the software is not foreseeable, thus rendering not possible specification of the physical location of the respective images in the memory.

Finally, it is clear that modifications and variations may be made to the disclosure described and illustrated herein, without thereby departing from the scope of the present invention, as defined in the annexed claims.

For instance, the method of management of the nonvolatile-memory device 1 envisages operations of refreshing of the data contained in the memory array 2, for example between step 26 and step 28 and/or between step 20 and step 22 and/or in any other moment, according to the need. In this case, access in reading to the informative content associated to the datum during refresh is guaranteed by a method implemented by the controller 8 that envisages the steps of: copying the datum to be refreshed in the auxiliary memory module 6; carrying out the aforementioned refresh of the datum in the memory array 2; and reading the informative content from the auxiliary memory module 6, during the step of refresh, and from the memory array 2, otherwise.

Consequently, refresh is carried out in a way transparent for the user, which has an uninterrupted access in reading and writing to the informative content of the entire nonvolatile-memory device, enabling use thereof for real-time applications.

What is claimed is:

1. A method for real-time management of a differential memory, the method comprising:
   storing first logic data associated with a first informative content in an auxiliary memory module of the differential memory, wherein the first logic data is stored in a first submodule of a first main memory module of the differential memory;
   storing third logic data associated with a second informative content in a second submodule of the first main memory module of the differential memory by overwriting second logic data associated with the first informative content, while maintaining the first logic data contained in the first submodule of the first main memory module of the differential memory unaltered, wherein the second logic data are complementary to the first logic data;
   receiving a request for reading the first informative content;
   when the third logic data is being stored, reading the first logic data from the auxiliary memory module of the differential memory in a single-ended mode in response to the request for reading the first informative content;
   when the third logic data is not being stored, reading the first logic data from the first submodule of the first main memory module of the differential memory in response to the request for reading the first informative content;
   receiving a request for reading the second informative content; and
   reading the third logic data in a single-ended mode in response to the request for reading the second informative content.

2. The method of claim 1, wherein storing the third logic data is carried out after storing the first logic data in the auxiliary memory module of the differential memory.

3. The method of claim 1, further comprising storing fourth logic data in the first submodule of the first main memory module of the differential memory by overwriting the first logic data, wherein the fourth logic data is complementary to the third logic data, and wherein storage of the fourth logic data in the first submodule of the first main memory module of the differential memory enables differential reading of the second informative content associated with the third and fourth logic data.

4. The method of claim 3, further comprising refreshing the first logic data, the second logic data, the third logic data, or the fourth logic data.

5. The method of claim 3, further comprising reading and rewriting the first logic data in the first submodule of the first main memory module of the differential memory, the second logic data in the second submodule of the first main memory module of the differential memory, the third logic data in the second submodule of the first main memory module of the differential memory, or the fourth logic data in the first submodule of the first main memory module of the differential memory.

6. The method of claim 1, wherein:
   the first informative content is further associated with fifth logic data and sixth logic data complementary to the fifth logic data;

the second informative content is further associated with seventh logic data;

the differential memory further comprises a second main memory module that includes a third submodule that stores the fifth logic data and a fourth submodule that stores the sixth logic data; and the method further comprises:

storing the fifth logic data in the auxiliary memory module of the differential memory;

storing the seventh logic data in the fourth submodule of the second main memory module of the differential memory by overwriting the sixth logic data while maintaining the fifth logic data contained in the third submodule of the second main memory module of the differential memory unaltered;

when the seventh logic data is being stored, reading the fifth logic data from the auxiliary memory module of the differential memory in a single-ended mode in response to the request for reading the first informative content;

when the seventh logic data is not being stored, reading the fifth logic data from the third submodule of the second main memory module of the differential memory;

reading the seventh logic data in a single-ended mode in response to the request for reading the second informative content.

7. The method of claim 6, wherein the auxiliary memory module of the differential memory comprises a fifth submodule and a sixth submodule, wherein the first, second, third, fourth, fifth, and sixth submodules are the same size, and wherein storing the first logic data in the auxiliary memory module of the differential memory comprises storing the first logic data in the fifth submodule of the auxiliary memory module of the differential memory.

8. The method of claim 7, wherein storing the fifth logic data in the auxiliary memory module of the differential memory comprises storing the fifth logic data in the sixth submodule of the auxiliary memory module of the differential memory.

9. The method of claim 1, wherein the differential memory is a phase-change memory.

10. A differential memory comprising:

a first main memory module comprising a first submodule configured to store first logic data associated with a first informative content and a second submodule configured to store second logic data that is complementary to the first logic data;

an auxiliary memory module; and a controller configured to:

control a storage operation of the first logic data in the auxiliary memory module;

control a storage operation of third logic data associated with a second informative content in the second submodule of the first main memory module by overwriting the second logic data associated with the first informative content, while maintaining the first logic data contained in the first submodule of the first main memory module unaltered;

receive a request for reading the first informative content;

when the third logic data is being stored, read the first logic data from the auxiliary memory module in a single-ended mode in response to the request for reading the first informative content;

when the third logic data is not being stored, read the first logic data from the first submodule of the first main memory module in response to the request for reading the first informative content;

receive a request for reading the second informative content; and read the third logic data in a single-ended mode in response to the request for reading the second informative content.

11. The differential memory of claim 10, wherein the controller is further configured to control the storage operation of the third logic data after controlling the storage operation of the first logic data.

12. The differential memory of claim 10, wherein the controller is further configured to control a storage operation of fourth logic data in the first submodule of the first main memory module to enable differential reading of the second informative content associated with the third and fourth logic data, wherein the fourth logic data is complementary to the third logic data, and wherein controlling the storage operation of the fourth logic data comprises overwriting the first logic data.

13. The differential memory of claim 12, wherein the controller is further configured to refresh the first logic data, the second logic data, the third logic data, or the fourth logic data.

14. The differential memory of claim 12, wherein the controller is further configured to read and rewrite the first logic data in the first submodule of the first main memory module, the second logic data in the second submodule of the first main memory module, the third logic data in the second submodule of the first main memory module, or the fourth logic data in the first submodule of the first main memory module.

15. The differential memory of claim 10, wherein:

the first informative content is further associated with fifth logic data and sixth logic data complementary to the fifth logic data;

the second informative content is further associated with seventh logic data;

the differential memory further comprises a second main memory module that includes a third submodule that stores the fifth logic data and a fourth submodule that stores the sixth logic data; and the controller is further configured to:

control a storage operation of the fifth logic data in the auxiliary memory module;

control a storage operation of the seventh logic data in the fourth submodule of the second main memory module by overwriting the sixth logic data while maintaining the fifth logic data contained in the third submodule of the second main memory module unaltered;

when the seventh logic data is being stored, read the fifth logic data from the auxiliary memory module in a single-ended mode in response to the request for reading the first informative content;

when the seventh logic data is not being stored, read the fifth logic data from the third submodule of the second main memory module; and read the seventh logic data in a single-ended mode in response to the request for reading the second informative content.

16. The differential memory of claim 15, wherein the auxiliary memory module comprises a fifth submodule and a sixth submodule, wherein the first, second, third, fourth, fifth, and sixth submodules are the same size, and wherein the controller is further configured to control the storage operation of the first logic data in the auxiliary memory module by storing the first logic data in the fifth submodule of the auxiliary memory module.

17. The differential memory of claim 16, wherein the controller is further configured to control the storage operation of the fifth logic data in the auxiliary memory module by storing the fifth logic data in the sixth submodule of the auxiliary memory module.

18. The differential memory of claim 10, wherein the differential memory is a phase-change memory (PCM).

19. A differential memory comprising:
a first main memory module comprising a first submodule configured to store first logic data associated with a first informative content and a second submodule configured to store second logic data that is complementary to the first logic data, wherein the first and second submodules of the first main memory module are the same size;
an auxiliary memory module; and
a controller configured to:
read and rewrite the first logic data in the first submodule of the first main memory module;
control a storage operation of the first logic data in the auxiliary memory module;
control a storage operation of third logic data associated with a second informative content in the second submodule of the first main memory module by overwriting the second logic data associated with the first informative content, while maintaining the first logic data contained in the first submodule of the first main memory module unaltered;
receive a request for reading the first informative content;
when the third logic data is being stored, read the first logic data from the auxiliary memory module in a single-ended mode in response to the request for reading the first informative content;
when the third logic data is not being stored, read the first logic data from the first submodule of the first main memory module in response to the request for reading the first informative content;
receive a request for reading the second informative content; and
read the third logic data in a single-ended mode in response to the request for reading the second informative content.

20. The differential memory of claim 19, wherein the differential memory is comprised in an electronic system, and wherein the electronic system is an electronic control unit of a vehicle, a personal digital assistant (PDA), a notebook, a mobile phone, a smartphone, a tablet, a digital audio player, a photographic camera, or a video camera.

21. The differential memory of claim 20, wherein the first and second informative content are control software or firmware of the electronic system.

22. The differential memory of claim 20, wherein storage of data associated with the second informative content is carried out in an over-the-air mode.

* * * * *